(12) United States Patent
Lee et al.

(10) Patent No.: US 8,378,353 B2
(45) Date of Patent: Feb. 19, 2013

(54) ORGANIC LIGHT EMITTING DIODE DISPLAY DEVICE AND METHOD OF MANUFACTURING THE SAME

(75) Inventors: Yul-Kyu Lee, Yongin (KR); Chun-Gi You, Yongin (KR); Sun Park, Yongin (KR)

(73) Assignee: Samsung Display Co., Ltd. (KR)

( * ) Notice: Subject to any disclaimer, the term of this patent is extended or adjusted under 35 U.S.C. 154(b) by 95 days.

(21) Appl. No.: 13/174,606

(22) Filed: Jun. 30, 2011

(65) Prior Publication Data

US 2012/0074414 A1    Mar. 29, 2012

(30) Foreign Application Priority Data

Sep. 29, 2010    (KR) ........................ 10-2010-0094462

(51) Int. Cl.
*H01L 33/16* (2010.01)
*H01L 33/08* (2010.01)

(52) U.S. Cl. .................... 257/59; 257/72; 257/E33.012; 438/34

(58) Field of Classification Search ........................ None
See application file for complete search history.

(56) References Cited

U.S. PATENT DOCUMENTS

| | | | | |
|---|---|---|---|---|
| 6,376,861 B1 * | 4/2002 | Yaegashi et al. | ................. | 257/59 |
| 6,771,328 B2 * | 8/2004 | Park et al. | ........................ | 349/42 |
| 7,605,091 B2 * | 10/2009 | Park et al. | ..................... | 438/754 |
| 7,635,436 B2 * | 12/2009 | Kim et al. | ........................ | 216/23 |
| 7,842,952 B2 * | 11/2010 | Koo et al. | ........................ | 257/59 |
| 8,207,534 B2 * | 6/2012 | Lee et al. | ........................ | 257/59 |
| 8,269,211 B2 * | 9/2012 | Lee et al. | ........................ | 257/40 |
| 8,304,782 B2 * | 11/2012 | Lin et al. | ......................... | 257/72 |
| 2004/0012028 A1 * | 1/2004 | Park et al. | ........................ | 257/88 |
| 2005/0017247 A1 | 1/2005 | Koo et al. | | |
| 2005/0077524 A1 * | 4/2005 | Ahn et al. | ........................ | 257/72 |
| 2006/0113903 A1 * | 6/2006 | Kim | .............................. | 313/506 |
| 2007/0029280 A1 * | 2/2007 | Lee et al. | ........................ | 216/41 |
| 2007/0145369 A1 * | 6/2007 | Kwak | ............................. | 257/59 |

(Continued)

FOREIGN PATENT DOCUMENTS

| | | |
|---|---|---|
| KR | 10-2001-0113266 | 12/2001 |
| KR | 10-2005-0012958 | 2/2005 |
| KR | 10-2006-0004877 | 1/2006 |
| KR | 10-2009-0120698 | 11/2009 |
| KR | 10-2011-0003201 | 1/2011 |

*Primary Examiner* — Thomas L Dickey
*Assistant Examiner* — Joseph Schoenholtz
(74) *Attorney, Agent, or Firm* — Knobbe Martens Olson & Bear, LLP

(57) ABSTRACT

An organic light emitting diode display device and a method of manufacturing the same are disclosed. The organic light emitting diode display device comprises: a substrate; an active layer disposed on the substrate; a first insulating layer disposed on the active layer; a gate electrode disposed on the first insulating layer; a pixel electrode disposed on the first insulating layer; source and drain electrodes electrically insulated from the gate electrode and electrically connected to the active layer; an intermediate layer disposed on the pixel electrode, wherein the intermediate layer comprises an organic emission layer; and an opposite electrode disposed on the intermediate layer, wherein the pixel electrode is connected to the source electrode or the drain electrode, wherein the gate electrode comprises a first conductive layer, a second conductive layer, a third conductive layer, and a fourth conductive layer that are sequentially stacked, and wherein the second and third conductive layers comprises a first oxidation-reduction potential difference therebetween, and the first and third conductive layers comprises a second oxidation-reduction potential difference therebetween, and the first oxidation-reduction potential difference is less than the second oxidation-reduction potential difference.

27 Claims, 5 Drawing Sheets

U.S. PATENT DOCUMENTS

| | | | |
|---|---|---|---|
| 2008/0157083 A1* | 7/2008 | Park et al. | 257/59 |
| 2008/0157099 A1* | 7/2008 | Yang et al. | 257/83 |
| 2008/0318368 A1* | 12/2008 | Ryu et al. | 438/151 |
| 2009/0284677 A1* | 11/2009 | Shin et al. | 349/46 |
| 2010/0062557 A1* | 3/2010 | Park | 438/34 |
| 2010/0285623 A1* | 11/2010 | Shih et al. | 438/34 |
| 2010/0314623 A1* | 12/2010 | Kwack | 257/59 |
| 2011/0001139 A1 | 1/2011 | Kim et al. | |
| 2011/0114960 A1* | 5/2011 | Lee et al. | 257/71 |
| 2011/0204373 A1* | 8/2011 | Qiu et al. | 257/59 |

* cited by examiner

ORGANIC LIGHT EMITTING DIODE DISPLAY DEVICE AND METHOD OF MANUFACTURING THE SAME

CROSS-REFERENCE TO RELATED PATENT APPLICATION

This application claims the benefit of Korean Patent Application No. 10-2010-0094462, filed on Sep. 29, 2010, in the Korean Intellectual Property Office, the disclosure of which is incorporated herein in its entirety by reference.

BACKGROUND

1. Field

The present technology relates to an organic light emitting diode (OLED) display device and a method of manufacturing the same, and more particularly, to an OLED display device and a method of manufacturing the same, which may inhibit the blistering of an insulating layer and the corrosion of a gate electrode.

2. Description of the Related Technology

In recent years, display devices are gradually becoming be superseded by portable thin flat panel displays ("FPD"s). Among the FPD's, the organic light emitting diode ("OLED") display devices or the inorganic light emitting diode ("ILED") display devices have attracted much attention as advanced display devices, because the OLED's or ILED's have wide viewing angles, good contrast, and fast response speeds. In addition, an OLED display device having an emission layer ("EML") formed of an organic material has a higher luminance, a higher driving voltage, and better response speed characteristics than an ILED device, and is capable of embodying various colors.

An OLED display device typically includes a cathode electrode and an anode electrode between which an organic EML is disposed. When a voltage is applied to the cathode and anode electrodes, the organic EML connected to the cathode and anode electrodes may emit visible light.

An OLED display device may include a plurality of thin layers, and a fine pattern having a desired shape may be formed in each of the thin layers. The formation of the fine pattern can involve a large number of processes. In this case, the fine pattern may be formed using various methods, mainly, by photolithography processes using a mask.

The photolithography processes may require fine control. Also, the formation of patterns using a mask may involve a plurality of operations, such as a photolithography forming operation, an exposure operation, a developing operation, and an etching operation. Therefore, as the number of operations of the photolithography process using the mask increases, processes for manufacturing an OLED display device may become complicated, a process time may be increased, and controlling the processes may become difficult, thus causing a lot of failures.

Furthermore, an OLED display device may include various electrodes formed using conductive thin layers. In this case, the electrical and emission characteristics of the OLED display device may be changed according to the electrical characteristics of the electrodes.

SUMMARY

An aspect of the present invention provides an organic light emitting diode (OLED) display device and a method of manufacturing the same, which may inhibit the blistering of an insulating layer and the corrosion of a gate electrode.

According to an aspect of the present invention, an OLED display device includes: a substrate; an active layer disposed on the substrate; a first insulating layer disposed on the active layer; a gate electrode disposed on the first insulating layer; a pixel electrode disposed on the same layer as the gate electrode; source and drain electrodes electrically insulated from the gate electrode and electrically connected to the active layer; an intermediate layer disposed on the pixel electrode and including an organic emission layer; and an opposite electrode disposed on the intermediate layer. The pixel electrode is connected to the source electrode or the drain electrode. The gate electrode includes a first conductive layer, a second conductive layer, a third conductive layer, and a fourth conductive layer that are sequentially stacked. The second and third conductive layers comprises a first oxidation-reduction potential ("ORP") difference therebetween, and the first and third conductive layers comprises a second ORP difference therebetween, and the first ORP difference is less than the second ORP difference.

The ORP between the second and third conductive layers may be 1V or less.

The second conductive layer may include indium zinc oxide (IZO), and the third conductive layer may include aluminum (Al) or aluminum-neodymium (AlNd).

The first conductive layer may include indium tin oxide (ITO).

The fourth conductive layer may include molybdenum (Mo).

The pixel electrode may include a first electrode layer, a second electrode layer, a third electrode layer, and a fourth electrode layer that are sequentially formed at the same layer as the gate electrode.

The second through fourth electrode layers of the pixel electrode may include a first opening exposing the first electrode layer disposed under the second electrode layer.

The intermediate layer may contact the first electrode layer of the pixel electrode.

The source electrode or the drain electrode may contact the fourth electrode layer.

A second insulating layer may be formed on the gate electrode and the pixel electrode to electrically insulate the gate electrode from the source and drain electrodes, the source and drain electrodes may be formed on the second insulating layer, and the second insulating layer may include a second opening corresponding to the first opening.

The OLED device may further include a pixel defining layer disposed on the source and drain electrodes. The pixel defining layer may include a third opening formed to overlap the first opening or formed corresponding to the first opening, and the intermediate layer may contact the first electrode layer through the third opening.

The first electrode layer may include ITO.

The OLED device may further include a capacitor including a first capacitor electrode and a second capacitor electrode. The first capacitor electrode may be disposed at the same layer as the active layer apart from the active layer. The second capacitor electrode may be electrically insulated from the first capacitor electrode and formed at the same layer as the gate electrode to correspond to the first capacitor electrode.

The second capacitor electrode may include a first layer, a second layer, a third layer, and a fourth layer that are sequentially formed at the same layer as the gate electrode.

The ORP difference between the second and third layers may be less than the ORP difference between the first and third layers.

The ORP between the second and third layers may be 1 V or less.

The second layer may include IZO, and the third layer may include Al or AlNd.

The first layer may include ITO.

The fourth layer may include Mo.

According to another aspect of the present invention, a method of manufacturing an OLED display device includes: a first mask process including forming a semiconductor layer on a substrate, patterning the semiconductor layer to form an active layer of a thin-film transistor (TFT) and a first capacitor electrode; a second mask process including stacking a first insulating layer and a first metal layer on the substrate to cover the active layer and the first capacitor electrode and patterning the first metal layer to form a pixel electrode, a gate electrode, and a second capacitor electrode; a third mask process including forming a second insulating layer to cover the pixel electrode, the gate electrode, and the second capacitor electrode and patterning the second insulating layer to form openings exposing the pixel electrode and source and drain regions of the active layer; a fourth mask process including forming a second metal layer to cover the pixel electrode and the openings and patterning the second metal layer to form source and drain electrodes; and a fifth mask process including forming a third insulating layer to cover the source and drain electrodes and patterning the third insulating layer to form a pixel defining layer exposing the pixel electrode. The first metal layer is formed by sequentially stacking a first film, a second film, a third film, and a fourth film on the first insulating layer. The ORP difference between the second and third films is less than the ORP difference between the first and third films.

The ORP difference between the second and third films may be 1V or less. The second film may include IZO, and the third film may include Al or AlNd. The first film may include ITO. The fourth film may include Mo.

The pixel electrode may include a first electrode layer, a second electrode layer, a third electrode layer, and a fourth electrode layer that are stacked on the first insulating layer. The gate electrode may include a first conductive layer, a second conductive layer, a third conductive layer, and a fourth conductive layer that are stacked on the first insulating layer. The second capacitor electrode may include the first layer, the second layer, the third layer, and the fourth layer. The first metal layer includes the first film, the second film, the third film, and the fourth film stacked on the first insulating layer.

The second mask process may include: sequentially stacking the first film, the second film, the third film, and the fourth film on the first insulating layer; patterning the second, third, and fourth films to form the second through fourth electrode layers of the pixel electrode, the second through fourth conductive layers of the gate electrode, and the second through fourth films of the second capacitor electrodes on the first film; and patterning the first film using the pixel electrode, the gate electrode, and the second capacitor electrode as a mask.

The patterning of the first film may include etching the first film to form the first electrode layer of the pixel electrode, the first conductive layer of the gate electrode, and the first film of the second capacitor electrode.

An undercut may be formed in the first conductive layer of the gate electrode.

Before the forming of the second insulating layer and after the patterning of the second insulating layer during the third mask process, the method may further include: doping the source and drain regions of the active layer with impurity ions by using the gate electrode as a mask; and performing a thermal process to activate the doped impurity ions.

The thermal process may be performed using a rapid thermal annealing (RTA) process.

The RTA process may include applying heat at a temperature of about 550° C. for one minute.

During the patterning of the second metal layer in the fourth mask process, the second through fourth electrode layers may be etched to expose the first electrode layer disposed under the second electrode layer.

BRIEF DESCRIPTION OF THE DRAWINGS

The above and other features and advantages of the present invention will become more apparent by describing in detail certain embodiments thereof with reference to the attached drawings in which.

DETAILED DESCRIPTION

Figure 1:
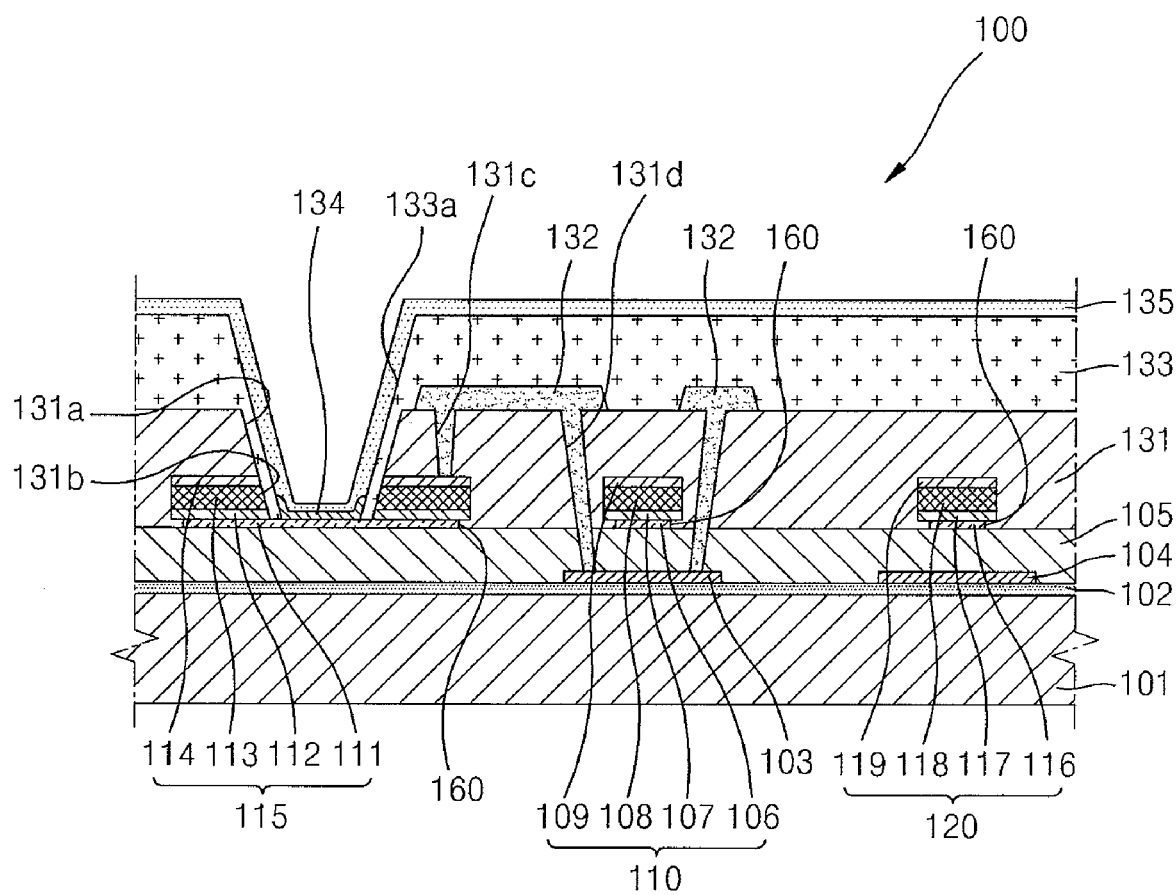
FIG. 1 is a cross-sectional view of an organic light emitting diode display device according to an embodiment of the present invention.

FIG. 1 is a cross-sectional view of an organic light emitting diode display device 100 according to a certain embodiment of the present invention.

The OLED display device 100 according to the present embodiment may include a substrate 101, an active layer 103, a gate electrode 110, a pixel electrode 115, source and drain electrodes 132, an intermediate layer 134, and an opposite electrode 135.

The substrate 101 may be formed of a transparent glass material containing $SiO_2$ as a main component. The substrate 101 is not limited thereto and may be formed of a transparent plastic material. The transparent plastic material may be an organic insulating material selected from the group consisting of polyethersulphone (PES), polyacrylate (PAR), polyetherimide (PEI), polyethyelene naphthalate (PEN), polyethylene terephthalate (PET), polyphenylene sulfide (PPS), polyallylate, polyimide (PI), polycarbonate (PC), cellulose tri-acetate (TAC), and cellulose acetate propionate (CAP).

In the case of a bottom emission OLED display device in which an image is embodied in the direction of the substrate 101, the substrate 101 should be formed of a transparent material. However, in the case of a top emission OLED display device in which an image is embodied in a reverse direction, the substrate 101 may not be formed of a transparent material. In this case, the substrate 101 may be formed of a metal. When the substrate 101 is formed of a metal, the substrate 101 may include at least one material selected from the group consisting of carbon (C), iron (Fe), chromium (Cr), manganese (Mn), nickel (Ni), titanium (Ti), molybdenum (Mo), stainless steel (SUS), an Invar alloy, an Inconel alloy, and a Kovar alloy, but the present invention is not limited thereto. The substrate 101 may be formed of a metal foil.

A buffer layer 102 may be formed on the substrate 101 in order to form a planar surface on the substrate 101 and inhibit diffusion of impurity elements into a top surface of the substrate 101. The buffer layer 102 may be formed of $SiO_2$ and/or $SiN_X$.

An active layer 103 having a predetermined pattern may be formed on the buffer layer 102. The active layer 103 may be formed of an inorganic or organic semiconductor, such as amorphous silicon ("a-Si") or polysilicon ("poly-Si"), and may include a source region, a drain region, and a channel region. The source and drain regions may be formed by doping the active layer 103, formed of a-Si or poly-Si, with impurity ions. P-type semiconductor source and drain regions may be formed when the active layer 103 is doped with a Group III element, such as boron (B), while N-type semiconductor source and drain regions may be formed when the active layer 103 is doped with a Group V element, such as nitrogen (N).

In the present embodiment, a first capacitor electrode 104 may be formed on the buffer layer 102 apart from the active layer 103. The first capacitor electrode 104 may be formed of an inorganic or organic semiconductor, such as a-Si or poly-Si.

A first insulating layer 105 may be formed on the active layer 103 and the first capacitor electrode 104. The first insulating layer 105 may be formed of an organic material or an inorganic material, such as $SiN_X$ or $SiO_2$, to electrically insulate the active layer 103 from the gate electrode 110.

The gate electrode 110 may be formed on the first insulating layer 105. The gate electrode 110 may be connected to a gate line (not shown) to which TFT on/off signals are applied.

The gate electrode 110 may include a first conductive layer 106, a second conductive layer 107, a third conductive layer 108, and a fourth conductive layer 109. That is, the gate electrode 110 may include first through fourth conductive layers 106, 107, 108, and 109 that may be sequentially stacked on the first insulating layer 105.

An oxidation-reduction potential (ORP) difference between the second and third conductive layers 107 and 108 may be less than the ORP difference between the first and third conductive layers 106 and 108. Also, the ORP difference between the second and third conductive layers 107 and 108 may be 1V or less. For example, the first conductive layer 106 may contain indium tin oxide (ITO), the second conductive layer 107 may contain indium zinc oxide (IZO), the third conductive layer 108 may contain aluminum (Al) or aluminum-neodymium (AlNd), and the fourth conductive layer 109 may contain molybdenum (Mo). Al has a standard ORP difference of about −1.662 V, IZO has a standard ORP difference of about −0.763 V, and ITO has a standard ORP difference of about +0.150 V.

By disposing the second conductive layer 107 formed of IZO between the first conductive layer 106 formed of ITO and the third conductive layer 108 formed of Al (or AlNd), corrosion of the second conductive layer 106 may be inhibited during the formation of the gate electrode 110. That is, referring to FIGS. 2B through 2D, the first, second, third, and fourth conductive layers 106, 107, 108, and 109 of the gate electrode 110 may be formed by etching a first film 141 formed of ITO, a second film 142 formed of IZO, a third film 143 formed of Al (or AlNd), and a fourth film 144 formed of Mo. When the first and third films 141 and 143 are stacked to directly contact each other without the second film 142 therebetween, galvanic corrosion may occur between the first and third films 141 and 143 during the etching of the first film 141 formed of ITO, thus corroding the third film 143 formed of Al. The corrosion of the third film 143 may occur due to a large ORP between the third and first layers 143 and 141 that directly contact each other. Thus, an oxidation reaction may occur in the third layer 143. However, according to an embodiment of the present invention, the second film 142 formed of IZO may be disposed between the first and third films 141 and 143, thereby inhibiting the corrosion of the third film 143 during the etching of the first film 141 formed of ITO. This is because the ORP between the second and third films 142 and 143 is less than the ORP between the first and third films 141 and 143.

The gate electrode 110 may have an undercut 160 formed at the first conductive layer 106. As described above, during the formation of the gate electrode 110, the first film 141, the second film 142, the third film 143, and the fourth film 144 may be stacked on the first insulating layer 105, and the second through fourth films 142, 143, and 144 may be patterned, thereby forming the second, third, and fourth conductive layers 107, 108, and 109. Afterwards, the first film 141 may be etched using the second through fourth conductive layers 107, 108, and 109 as a mask, thereby forming the first conductive layer 106. Thus, the undercut 160 may be formed at the first conductive layer 106.

Since each of the third and fourth conductive layers 108 and 109 of the gate electrode 110 is a double layer formed of Al(AlNd)/Mo, blistering may be inhibited during a thermal process. More specifically, the manufacture of the OLED 100 may include forming the pixel electrode 115, the gate electrode 110, and the second capacitor electrode 120, doping impurity ions, and performing a thermal process to activate the doped impurity ions. When high heat is applied during the thermal process, stress may occur at an interface between conductive layers of the gate electrode 110, thus causing blistering of the second insulating layer 131 formed on the pixel electrode 115, the gate electrode 110, and the second capacitor electrode 120. In particular, great stress may occur at an interface between the third conductive layer 108 formed of Al(AlNd) and the fourth conductive layer 109 formed of Mo. Conventionally, a gate electrode is formed using a triple layer formed of Mo/Al/Mo. In this case, top and bottom surfaces of an Al layer contact Mo layers, thus causing serious blistering. However, according to an embodiment of the present invention, the gate electrode 110 may be formed using a double layer formed of Mo/Al to reduce blistering. In particular, when the RTA process is performed for about 1 minute at a temperature of about 550° C., blistering is not generated.

Also, in an embodiment of the present invention, as described above, the second conductive layer 107 formed of IZO may be disposed between the third conductive layer 108 formed of Al(AlNd) and the first conductive layer 106 formed of ITO to reduce the corrosion of the third conductive layer 108 during the formation of the gate electrode 110.

Hence, according to an embodiment of the present invention, the gate electrode 110 may be formed using the first conductive layer 106, the second conductive layer 107, the third conductive layer 108, and the fourth conductive layer 109, which inhibit corrosion of the third conductive layer 108.

The pixel electrode 115 may be formed at the same layer (i.e., the first insulating layer 105) as the gate electrode 110 apart from the gate electrode 110. The pixel electrode 115 may include a first electrode layer 111, a second electrode layer 112, a third electrode layer 113, and a fourth electrode layer 114.

The pixel electrode 115 may be formed using the same process as the gate electrode 110. More specifically, referring to FIGS. 2B through 2D, the first film 141 formed of ITO, the second film 142 formed of IZO, the third film 143 formed of Al (or AlNd), and the fourth film 144 formed of Mo may be stacked on the first insulating layer 105, thereby forming a first metal layer 140. The first metal layer 140 may be patterned, thereby forming the pixel electrode 115 and the gate electrode 110. Thus, the first, second, third, and fourth electrode layers 111, 112, 113, and 114 of the pixel electrode 115 may be respectively formed of the same materials as the first, second, third, and fourth conductive layers 106, 107, 108, and 109 of the gate electrode 110. Therefore, also in the pixel electrode 115, the ORP between the second and third electrode layers 112 and 113 may be less than the ORP between the first and third electrode layers 111 and 113. Also, the ORP between the second and third electrode layers 112 and 113 may be 1 V or less. For example, the first electrode layer 111 may be formed of ITO, the second electrode layer 112 may be formed of IZO, the third electrode layer 113 may be formed of Al or AlNd, and the fourth electrode layer 114 may be formed of Mo.

The second, third, and fourth electrode layers 112, 113, and 114 may include a first opening 131*b* exposing the first electrode layer 111. Thus, the intermediate layer 134 may contact the first electrode layer 111. The first electrode layer 111 may be formed of ITO, particularly, crystallized ITO. Specifically, the first electrode layer 111 may contain poly-crystalline ITO, which is denser and more durable than amorphous ITO.

The pixel electrode 115 may be bonded to the intermediate layer 134, and the electrical and emission characteristics of the OLED device 100 may be greatly affected by the bonding characteristics. Therefore, surface characteristics of a portion of the pixel electrode 115, which contacts the intermediate layer 134, may significantly affect the electrical and emission characteristics of the OLED device 100. In the present embodiment, the first electrode layer 111 of the pixel electrode 115 may contact the intermediate layer 134. In this case, since the first electrode layer 111 contains polycrystalline ITO and is highly durable, damage to the surface of the first electrode layer 111 may be inhibited during a subsequent process, particularly, a subsequent etching process. As a result, bonding characteristics between the first electrode layer 111 and the intermediate layer 134 may be enhanced.

Like the first conductive layer 106, the first electrode layer 111 of the pixel electrode 115 may have the undercut 160.

A second capacitor electrode 120 may be formed on the first insulating layer 105 to correspond to the first capacitor electrode 104. The second capacitor electrode 120 may be formed of the same materials used in the process of forming the gate electrode 110. More specifically, referring to FIGS. 2B through 2D, the first film 141 formed of ITO, the second film 142 formed of IZO, the third film 143 formed of Al (or AlNd), and the fourth film 144 formed of Mo may be stacked on the first insulating layer 105, thereby forming the first metal layer 140. The first metal layer 140 may be patterned, thereby forming not only the pixel electrode 115 and the gate electrode 110 but also the second capacitor electrode 120. Thus, the first layer 116, the second layer 117, the third layer 118, and the fourth layer 119 of the second capacitor electrode 120 may be respectively formed of the same materials as the first conductive layer 106, the second conductive layer 107, the third conductive layer 108, and the fourth conductive layer 109 of the gate electrode 110. Therefore, in the second capacitor electrode 120, the ORP between the second and third layers 117 and 118 may be less than the ORP between the first and third layers 116 and 118. Also, the ORP between the second and third layers 117 and 118 may be 1 V or less. For example, the first layer 116 may be formed of ITO, the second layer 117 may be formed of IZO, the third layer 118 may be formed of Al or AlNd, and the fourth layer 119 may be formed of Mo.

The first layer 116 of the second capacitor electrode 120 may have the undercut 160.

In the present embodiment, since the first capacitor electrode 104 and the second capacitor electrode 120 between which the first insulating layer 105 is interposed to form a single capacitor are formed at the same layers as the active layer 103 and the gate electrode 110, respectively, the thickness of the OLED device 100 may be effectively reduced.

A second insulating layer 131 may be formed on the gate electrode 110, the pixel electrode 115, and the second capacitor electrode 120. The second insulating layer 131 may be formed using various insulator materials. For example, the second insulating layer 131 may be formed of an inorganic material, such as an oxide or a nitride, or an organic material.

The second insulating layer 131 may be foamed using an inorganic insulating layer or an organic insulating layer. The inorganic insulating layer may include $SiO_2$, $SiN_x$, SiON, $Al_2O_3$, $TiO_2$, $Ta_2O_5$, $HfO_2$, $ZrO_2$, barium strontium titanate (BST), or lead zirconate titanate (PZT). The organic insulating layer may include typical polymers for general use (e.g., PMMA and PS), a polymer derivative having a phenol group, an acryl polymer, an imide polymer, an aryl ether polymer, an amide polymer, a fluorine polymer, a p-xylene polymer, a vinyl alcohol polymer, and a blend thereof. The second insulating layer 131 may be formed of a composite stack structure of an inorganic insulating layer and an organic insulating layer.

The second insulating layer 131 may include a second opening 131*a*, which may correspond to the first opening 131*b*.

The second insulating layer 131 may include a fifth opening 131*d* exposing source and drain regions, and the source and drain electrodes 132 may be respectively formed in the fifth opening 131*d* to contact source and drain regions of the active layer 103. In the present embodiment, any one of the source and drain electrodes 132 may be connected to the pixel electrode 115. More specifically, any one of the source and drain electrodes 132 may be connected to the fourth electrode layer 114 of the pixel electrode 115 through a fourth opening 131*c*.

The source and drain electrodes 132 may be formed to have a triple-layer structure, such as a stack structure formed of Ti/Al/Ti.

A pixel defining layer 133 may be formed on the source and drain electrodes 132. The pixel defining layer 133 may include a third opening 133*a*. The third opening 133*a* may be formed to expose the first electrode layer 111 of the pixel electrode 115. The third opening 133*a* may overlap the first opening 131*b* or may be formed corresponding to the first opening 131*b*. The overlap of the third opening 133*a* over the first opening 131*b* is like the embodiment shown in FIG. 1 in that the third opening 133*a* is formed above the first opening 131*b*. Alternatively, the third opening 133*a* may be formed corresponding to the first opening 131*b* so that the third opening 133*a* looks as one opening with the first opening 131*b*. The pixel defining layer 133 may be formed of an organic material or an inorganic material.

An intermediate layer 134 may be formed within the third opening 133*a* to contact the first electrode layer 111 of the pixel electrode 115. The intermediate layer 134 may include an organic EML.

The intermediate layer 134 may emit light due to electrical operations of the pixel electrode 115 and the opposite electrode 135.

The intermediate layer 134 may be formed of an organic material. When the organic EML of the intermediate layer 134 is formed of an organic monomer, a hole transport layer ("HTL") and a hole injection layer ("HIL") may be stacked from the organic EML toward the pixel electrode 115, and an electron transport layer ("ETL") and an electron injection layer ("EIL") may be stacked from the organic EML toward the opposite electrode 135. In addition, various layers may be stacked if required. The intermediate layer 134 may be formed of an organic material, such as copper phthalocyanine (CuPc), (N,N'-Di(naphthalene-1-yl)-N,N'-diphenyl-benzidine (NPB), tris-8-hydroxyquinoline aluminum)(Alq3), or various other materials.

When the organic EML of the intermediate layer 134 is formed of an organic polymer, only a polymer HTL may be formed from the organic EML toward the pixel electrode 115. The polymer HTL may be formed of poly-(2,4)-ethylenedihydroxy thiophene (PEDOT) or polyaniline (PANI) over the pixel electrode 115 using an inkjet printing technique or a spin coating technique. The organic polymer EML may be formed using poly(p-phenylene vinylene) (PPV), soluble PPV, cyano-PPV, or polyfluorene, and a color pattern may be formed using a typical method, such as an inkjet printing method, a spin coating method, or a laser induced thermal imaging ("LITI") method.

An opposite electrode 135 may be formed on the intermediate layer 134. The formation of the opposite electrode 135 may include depositing a metal having a small work function, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a mixture or alloy thereof, and depositing a transparent conductive material, such as ITO, IZO, ZnO, or $In_2O_3$, on the deposited metal.

A sealing member (not shown) may be disposed on the opposite electrode 135. The sealing member may be formed of a transparent material to protect the intermediate layer 134 and other layers from external moisture or oxygen. To this end, the sealing member may be formed using glass, a plastic material, or a stack structure of a plurality of organic and inorganic materials.

FIGS. 2A through 2G are cross-sectional views illustrating a method of manufacturing the OLED display device of FIG. 1.

The method of manufacturing the OLED display device of FIG. 1, according to the present embodiment, will be sequentially described with reference to FIGS. 2A through 2G.

Figure 2A:
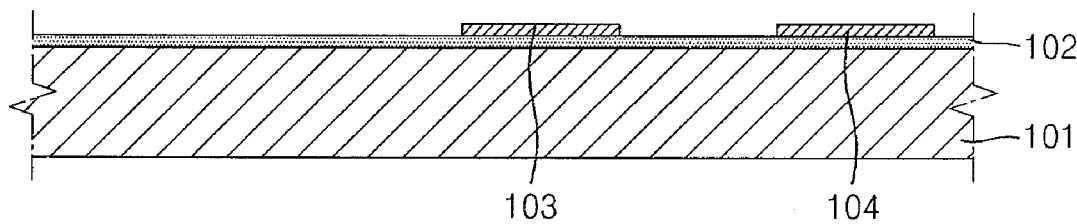
FIGS. 2A through 2I are cross-sectional views illustrating a method of manufacturing the OLED device of FIG. 1.

To begin with, referring to FIG. 2A, a first mask process may be performed. Specifically, a buffer layer 102 may be formed on a substrate 101, and an active layer 103 and a first capacitor electrode 104 may be formed on the buffer layer 102. The active layer 103 and the first capacitor electrode 104 may have predetermined patterns spaced apart from each other. In this case, the active layer 103 and the first capacitor electrode 104 may be simultaneously formed by a photolithography technique using one mask.

Figure 2B:
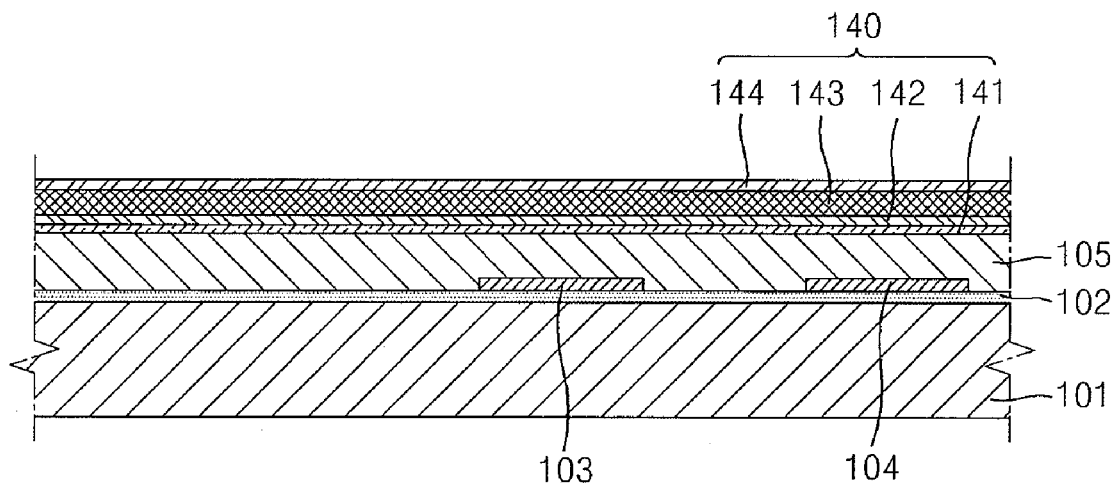

Referring to FIG. 2B, a first insulating layer 105 may be formed on the active layer 103 and the first capacitor electrode 104, and a first metal layer 140 may be formed on the first insulating layer 105. The first metal layer 140 may include a first film 141, a second film 142, a third film 143, and a fourth film 144 that are sequentially stacked on the first insulating layer 105. The first film 141 may be formed of the same material as a first conductive layer 106, a first electrode layer 116, and a first layer 116 and include ITO. The second film 142 may be formed of the same material as a second conductive layer 107, a second electrode layer 117, and a second layer 117 and include IZO. The third film 143 may be formed of the same material as a third conductive layer 108, a third electrode layer 118, and a third layer 118 and include Al or AlNd. The fourth film 144 may be formed of the same material as a fourth conductive layer 109, a fourth electrode layer 119, and a fourth layer 119 and include Mo.

Figure 2C:
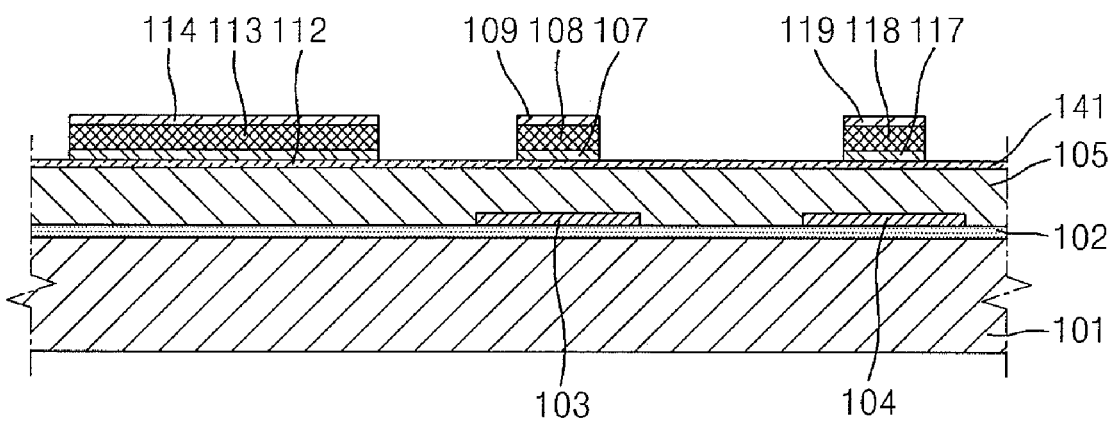

Referring to FIG. 2C, a second mask process may be performed. Specifically, the second film 142, the third film 143, and the fourth film 144 formed on the first insulating layer 105 may be sequentially patterned, thereby forming the second through fourth conductive layers 107, 108, and 109 sequentially stacked on the first film 141, forming the second through fourth electrode layers 112, 113, and 114 sequentially stacked on the first film 141, and forming the second through fourth layers 117, 118, and 119 sequentially stacked on the first film 141. The second through fourth films 142, 143, and 144 may be patterned by a lithography process using a single mask.

Figure 2D:
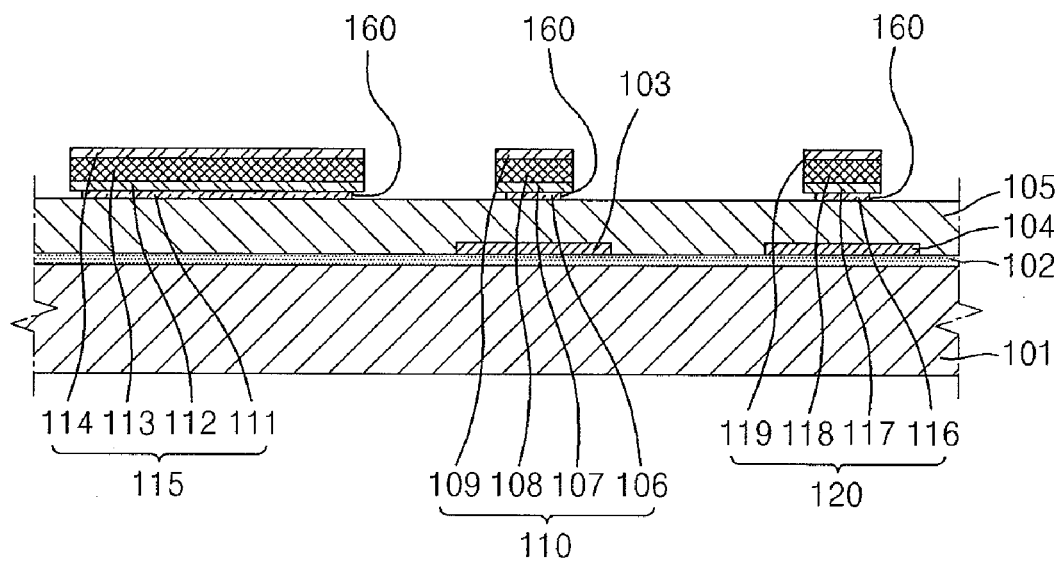

Referring to FIG. 2D, the first film 141 may be etched, thereby forming a pixel electrode 115, a gate electrode 110, and a second capacitor electrode 120. More specifically, the first film 141 may be etched using the second through fourth conductive layers 107, 108, and 109 sequentially stacked on the first film 141, the second through fourth electrode layers 112, 113, and 114 sequentially stacked on the first film 141, and the second through fourth layers 117, 118, and 119 sequentially stacked on the first film 141 as a self-alignment mask. Thus, an undercut may be formed at the first electrode layer 111, the first conductive layer 106, and the first layer 116.

As described above, the first film 141 formed of ITO, the second film 142 formed of IZO, the third film 143 formed of Al (or AlNd), and the fourth film 144 formed of Mo may be etched. In this case, if the first and third films 141 and 143 are stacked without the second film 142 therebetween and directly contact each other, galvanic corrosion may occur between the first and third films 141 and 143 during the etching of the first film 141 formed of ITO, thus causing the corrosion of the third film 143 formed of Al. This is because there is a large ORP between the first and third films 141 and 143 stacked to contact each other and may result in an oxidation reaction in the third film 143. However, according to an embodiment of the present invention, as described above, the second film 142 formed of IZO may be interposed between the first and third films 141 and 143, thereby inhibiting the corrosion of the third film 143 during the etching of the first film 141 formed of ITO. This is because the ORP between the second and third films 142 and 143 is less than the ORP between the first and third films 141 and 143.

Figure 2E:
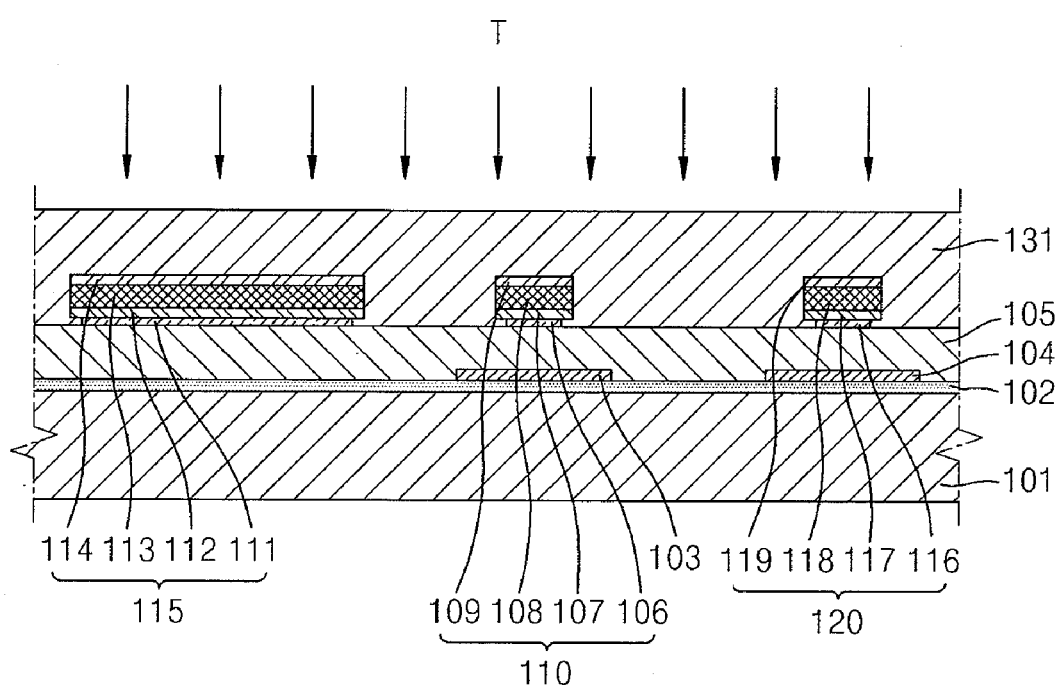

Referring to FIG. 2E, a second insulating layer 131 may be formed on the gate electrode 110, the pixel electrode 115, and the second capacitor electrode 120. The second insulating layer 131 may be formed of various insulator materials. For example, the second insulating layer 131 may be formed of an inorganic material, such as an oxide or a nitride, or an organic material.

The inorganic material forming the second insulating layer 131 may include $SiO_2$, $SiN_x$, SiON, $Al_2O_3$, $TiO_2$, $Ta_2O_5$, $HfO_2$, $ZrO_2$, BST, or PZT, and the organic material forming the second insulating layer 131 may include typical polymers for general use (e.g., polymethylmethacrylate (PMMA) and polystyrene (PS)), a polymer derivative having a phenol group, an acryl polymer, an imide polymer, an aryl ether polymer, an amide polymer, a fluorine polymer, a p-xylene polymer, a vinyl alcohol polymer, and a blend thereof. The second insulating layer 131 may be formed of a composite stack structure of an inorganic insulating layer and an organic insulating layer.

After forming the second insulating layer 131, impurity ions may be doped. As a result, the active layer 103 may include source and drain regions (not shown) doped with impurity ions and a channel region (not shown) interposed therebetween. That is, by use of the gate electrode 110 as a self-aligned mask, the source and drain regions may be formed without using an additional photomask.

After doping the impurity ions, a thermal process T may be performed to activate the doped impurity ions. The thermal process T may be a rapid thermal annealing (RTA) process, particularly, which is performed for about 1 minute at a temperature of about 550° C.

When high heat is applied during the thermal process T, stress is generated at an interface between conductive layers of the gate electrode 110, thereby blistering the second insulating layer, 131 formed on the pixel electrode 115, the gate electrode 110, and the second capacitor electrode 120. In particular, great stress may occur at an interface between the third conductive layer 108 formed of Al(AlNd) and the fourth conductive layer 109 formed of Mo. Conventionally, a gate electrode is formed using a triple layer formed of Mo/Al/Mo. In this case, top and bottom surfaces of an Al layer contact Mo layers, thus causing serious blistering. However, according to one embodiment of the present invention, the gate electrode 110 is formed using a double layer formed of Mo/Al to reduce blistering. In particular, when the RTA process is performed for about 1 minute at a temperature of about 550° C., blistering is not generated.

Figure 2F:
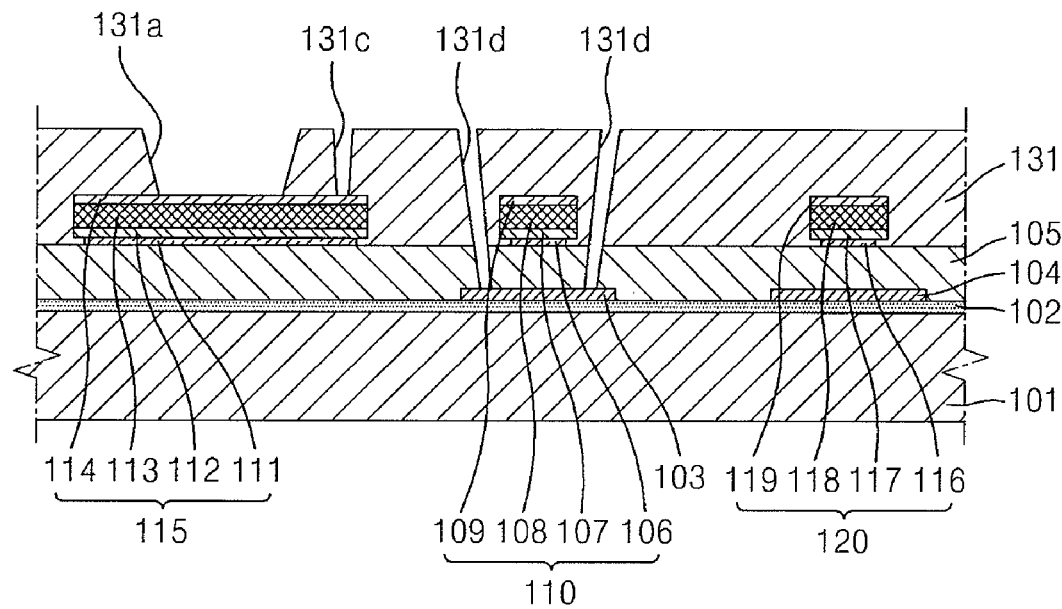

Referring to FIG. 2F, a third mask process may be performed. The second insulating layer 131 may be formed to cover the gate electrode 110, and second, fourth, and fifth openings 131a, 131c, and 131d may be formed in the second insulating layer 131.

In the illustrated embodiment, the source and drain regions of the active layer 103 are exposed through the fifth opening 131d formed in the first and second insulating layers 105 and 131. The formation of the second, fourth, and fifth openings 131a, 131c, and 131d may be performed using a photolithography technique. Also, the second opening 131a may be formed in the second insulating layer 131. The fourth electrode layer 114 of the pixel electrode 115 may be exposed through the second opening 131a. Furthermore, the fourth opening 131c may be further formed in the second insulating layer 131 to expose the fourth electrode layer 114 of the pixel electrode 115 so that source and drain electrodes can be connected to the pixel electrode 115.

Figure 2G:
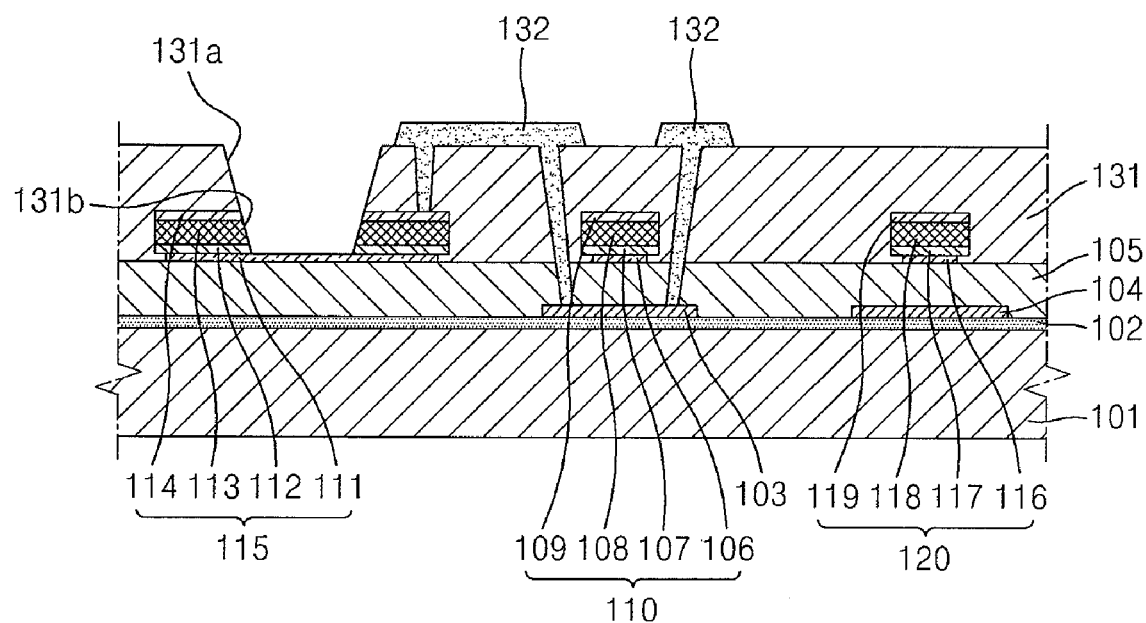

Referring to FIG. 2G, a fourth mask process may be performed. Specifically, source and drain electrodes 132 may be formed. The formation of the source and drain electrodes 132 may include forming a second metal layer to cover the pixel electrode 115 and the second, fourth, and fifth openings 131a, 131c, and 131d and patterning the second metal layer. The source and drain electrodes 132 may respectively contact the source and drain regions of the active layer 103. Also, any one of the source and drain electrodes 132 may contact the pixel electrode 115, specifically, the fourth electrode layer 114.

The source and drain electrodes 132 may be formed using various conductive layers to have various structures. Specifically, the source and drain electrodes 132 may be formed to have a Ti/Al/Ti stack structure.

A first opening (131b in FIG. 1) may be formed in the second, third, and fourth electrode layers 112, 113, and 114 of the pixel electrode 115. The fourth, third, and second electrode layers 114, 113, and 112 exposed by the second opening 131a formed in the second insulating layer 131 may be etched, thereby forming the first opening 131b. The first opening 131b may be formed to correspond to the second opening 131a.

The etching of the second, third, and fourth electrode layers 112, 113, and 114 may be performed using a wet etching process using an oxalic acid solution, a nitric acid solution, a sulfuric acid solution, or cerium ammonium nitride (CAN) as an etchant. However, the present invention is not limited thereto, and various other etchants for etching Mo, Al(AlNd), and IZO, such as a phosphoric acid solution and an acetic acid solution, may be used.

While the first opening 131b is formed by etching the second through fourth electrode layers 112, 113, and 114, the first electrode layer 111 may be neither influenced by an etchant nor etched because the first electrode layer 111 contains crystallized ITO to increase durability and etching resistance. The first electrode layer 111 may not be etched during the etching of the second electrode layer 112 containing IZO. Thus, an exposed region of the pixel electrode 115, which is not covered with the second insulating layer 131, may not be damaged, thereby improving bonding characteristics between the pixel electrode 115 and an intermediate layer 134 during a subsequent process.

Figure 2H:
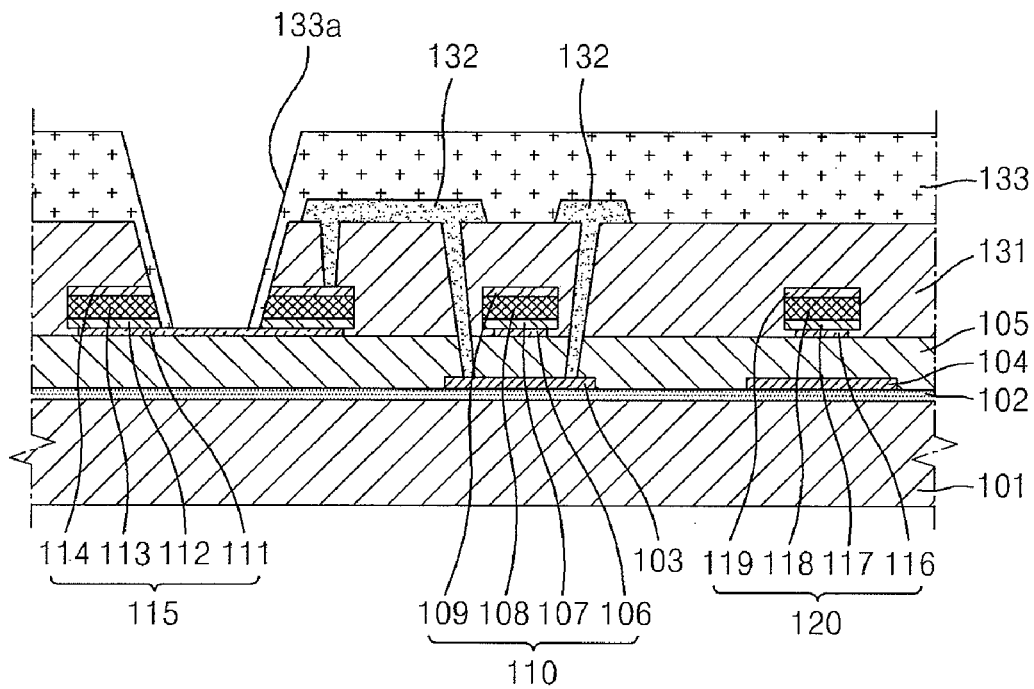

Referring to FIG. 2H, a fifth mask process may be performed. Specifically, a pixel defining layer 133 may be formed on the source and drain electrodes 132. The pixel defining layer 133 may be formed of an organic material.

A third opening 133a may be formed in the pixel defining layer 133 and contact the first opening 131b or be disposed within the first opening 131b. The first electrode layer 111 of the pixel electrode 115 may be exposed through the third opening 133a. The formation of the third opening 133a may be performed using an etching process for removing a predetermined region of the pixel defining layer 133. The surface of the pixel electrode 115 may be typically damaged during the etching process. However, since the first electrode layer 111 according to the present invention contains crystallized ITO, the durability of the first electrode layer 111 may be improved, so the first electrode layer 111 may not be affected by the etchant.

Figure 2I:
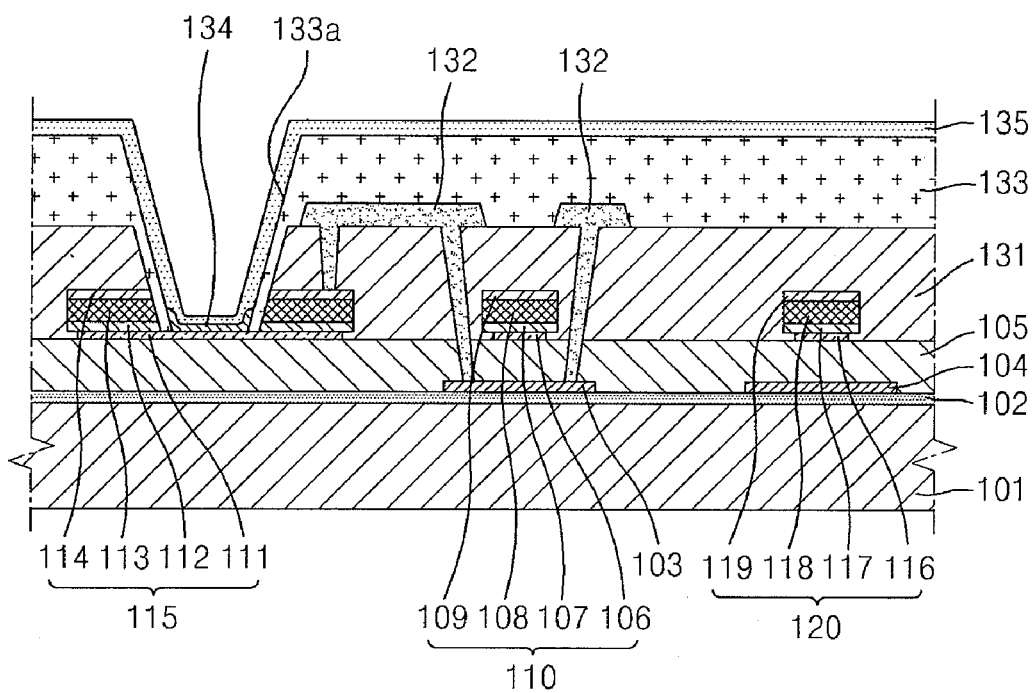

Referring to FIG. 2I, an intermediate layer 134 and an opposite electrode 135 may be sequentially formed on the first electrode layer 111 of the pixel electrode 115, which is exposed by the third opening 133a of the pixel defining layer 133. The intermediate layer 134 may include an organic EML. Since materials forming the intermediate layer 134 and the opposite electrode 135 may be the same as in the previous embodiment, their description will not be provided.

Although not shown, a sealing member (not shown) may be disposed on the electrode 135 opposite one surface of the substrate 101. The sealing member may be formed of a transparent material to protect the intermediate layer 134 from external moisture or oxygen. To this end, the sealing member may be formed using glass, a plastic material, or a stack structure of a plurality of organic and inorganic materials.

In the present embodiment, the gate electrode 110 and the pixel electrode 115 may be formed at the same layer and using the same material, thus simplifying the manufacture of the OLED display device. Also, in the present embodiment, the first capacitor electrode 104 may be formed at the same layer and using the same material as the active layer 103 at the same time, and the second capacitor electrode 120 may be formed at the same time as the gate electrode 110, thereby simplifying the process.

In the present embodiment, the gate electrode 110 may have a stack structure of four layers, thus obtaining a resistance reduction effect. Also, the ORP difference between the second and third conductive layers 107 and 108 of the gate electrode 110 may be less than the ORP difference between the first and third conductive layers 106 and 108 of the gate electrode 110. In particular, since the ORP difference between the second and third conductive layers 107 and 108 is about 1 V or less, the corrosion of the third conductive layer 108 may be inhibited. Furthermore, since the gate electrode 110 has a double structure of the third and fourth conductive layers 108 and 109, the blistering of the second insulating layer 131 may be inhibited.

According to other embodiments, the gate electrode 110 may have a stack structure having more than four layers. For example, other embodiments may include one or more layers between insulating layer 105 and first conductive layer 106, or one or more layers between fourth conductive layer 109 and insulating layer 131.

The second capacitor electrode 120 may have the same structure as the gate electrode 110, thus obtaining the same effects.

The first electrode layer 110 of the pixel electrode 115, which contacts the intermediate layer 134, may contain crystallized ITO to improve durability, thereby inhibiting damage to the surface of the first electrode layer 111 during a subsequent process.

As a result, interface characteristics between the first electrode layer 111 and the intermediate layer 134 that contact each other may be improved, thus enhancing the electrical and emission characteristics of the OLED display device.

An OLED display device and a method of manufacturing the same according to the present invention can inhibit the blistering of an insulating layer and the corrosion of a gate electrode.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting diode display device comprising:
    a substrate;
    an active layer disposed on the substrate;
    a first insulating layer disposed on the active layer;
    a gate electrode disposed on the first insulating layer;
    a pixel electrode disposed on the first insulating layer;
    source and drain electrodes electrically insulated from the gate electrode and electrically connected to the active layer;
    an intermediate layer disposed on the pixel electrode, wherein the intermediate layer comprises an organic emission layer; and
    an opposite electrode disposed on the intermediate layer,
    wherein the pixel electrode is connected to the source electrode or the drain electrode,
    wherein the gate electrode comprises a first conductive layer, a second conductive layer, a third conductive layer, and a fourth conductive layer that are sequentially stacked,
    and wherein the second and third conductive layers comprises a first oxidation-reduction potential difference therebetween, and the first and third conductive layers comprises a second oxidation-reduction potential difference therebetween, and the first ORP difference is less than the second oxidation-reduction potential difference.

2. The device of claim 1, wherein the first oxidation-reduction potential difference is 1V or less.

3. The device of claim 2, wherein the second conductive layer comprises indium zinc oxide (IZO), and the third conductive layer comprises aluminum (Al) or aluminum-neodymium (AlNd).

4. The device of claim 3, wherein the first conductive layer comprises indium tin oxide (ITO).

5. The device of claim 1, wherein the fourth conductive layer comprises molybdenum (Mo).

6. The device of claim 1, wherein the pixel electrode comprises a first electrode layer, a second electrode layer, a third electrode layer, and a fourth electrode layer that are sequentially stacked and formed of the same materials as the first, second, third and fourth conductive layers.

7. The device of claim 6, wherein the first electrode layer comprises ITO.

8. The device of claim 1, further comprising a capacitor including a first capacitor electrode disposed on the same layer as the active layer apart from the active layer, and a second capacitor electrode electrically insulated from the first capacitor electrode and formed on the same layer as the gate electrode.

9. The device of claim 8, wherein the second capacitor electrode comprises a first layer, a second layer, a third layer, and a fourth layer that are sequentially stacked and disposed on the same layer as the gate electrode.

10. The device of claim 9, wherein the oxidation-reduction potential difference between the second and third layers is less than the ORP between the first and third layers.

11. The device of claim 9, wherein the oxidation-reduction potential difference between the second and third layers is 1V or less.

12. The device of claim 9, wherein the second layer comprises indium zinc oxide (IZO), and the third layer includes aluminum (Al) or aluminum-neodymium (AlNd).

13. The device of claim 12, wherein the first layer comprises indium tin oxide (ITO).

14. The device of claim 9, wherein the fourth layer comprises Mo.

15. A method of manufacturing an organic light emitting diode display device, the method comprising:
    a first mask process including forming a semiconductor layer on a substrate, patterning the semiconductor layer to form an active layer of a thin-film transistor and a first capacitor electrode;
    a second mask process including stacking a first insulating layer and a first metal layer on the substrate to cover the active layer and the first capacitor electrode, and patterning the first metal layer to form a pixel electrode, a gate electrode, and a second capacitor electrode;
    a third mask process including forming a second insulating layer to cover the pixel electrode, the gate electrode, and the second capacitor electrode, and patterning the second insulating layer to form openings exposing the pixel electrode and source and drain regions of the active layer;
    a fourth mask process including forming a second metal layer to cover the pixel electrode and the openings, and patterning the second metal layer to form source and drain electrodes; and
    a fifth mask process including forming a third insulating layer to cover the source and drain electrodes, and patterning the third insulating layer to form a pixel defining layer exposing the pixel electrode,
    wherein the first metal layer is formed by sequentially stacking a first film, a second film, a third film, and a fourth film on the first insulating layer,
    and wherein the second and third conductive layers comprises a first oxidation-reduction potential difference therebetween, and the first and third conductive layers comprises a second oxidation-reduction potential difference therebetween, and the first oxidation-reduction potential difference is less than the second oxidation-reduction potential difference.

16. The method of claim 15, wherein the first oxidation-reduction potential difference is 1V or less.

17. The method of claim 15, wherein the second film comprises indium zinc oxide (IZO), and the third film comprises aluminum (Al) or aluminum-neodymium (AlNd).

18. The method of claim 17, wherein the first film comprises indium tin oxide (ITO).

19. The method of claim 15, wherein the fourth film comprises molybdenum (Mo).

20. The method of claim 15, wherein the pixel electrode comprises a first electrode layer, a second electrode layer, a third electrode layer, and a fourth electrode layer that are stacked on the first insulating layer, wherein the gate electrode comprises a first conductive layer, a second conductive layer, a third conductive layer, and a fourth conductive layer that are stacked on the first insulating layer, wherein the second capacitor electrode includes the first layer, the second layer, the third layer, and the fourth layer, and wherein the first metal layer includes the first film, the second film, the third film, and the fourth film stacked on the first insulating layer.

21. The method of claim 20, wherein the second mask process includes:

sequentially stacking the first film, the second film, the third film, and the fourth film on the first insulating layer;

patterning the second, third, and fourth films to form the second through fourth electrode layers of the pixel electrode, the second through fourth conductive layers of the gate electrode, and the second through fourth films of the second capacitor electrodes on the first film; and patterning the first film using the pixel electrode, the gate electrode, and the second capacitor electrode as a mask.

22. The method of claim 21, wherein the patterning of the first film comprises etching the first film to form the first electrode layer of the pixel electrode, the first conductive layer of the gate electrode, and the first film of the second capacitor electrode.

23. The method of claim 22, wherein an undercut is formed at the first conductive layer of the gate electrode.

24. The method of claim 15, further comprising:

doping the source and drain regions of the active layer with impurity ions by using the gate electrode as a mask; and performing a thermal process to activate the doped impurity ions, wherein the doping and the thermal process occurs before forming of the second insulating layer and after the patterning of the second insulating layer during the third mask process.

25. The method of claim 24, wherein the thermal process is performed using a rapid thermal annealing process.

26. The method of claim 25, wherein the RTA process includes applying heat at a temperature of about 550° C. for one minute.

27. The method of claim 20, wherein during the patterning of the second metal layer in the fourth mask process, the second through fourth electrode layers are etched to expose the first electrode layer disposed under the second electrode layer.

* * * * *